(12) United States Patent
Sasaki (10) Patent No.: US 7,129,587 B2
(45) Date of Patent: Oct. 31, 2006

(54) SEMICONDUCTOR DEVICE, SEMICONDUCTOR PACKAGE FOR USE THEREIN, AND MANUFACTURING METHOD THEREOF

(75) Inventor: Takaaki Sasaki, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/690,627

(22) Filed: Oct. 23, 2003

(65) Prior Publication Data

US 2004/0082102 A1 Apr. 29, 2004

Related U.S. Application Data (62) Division of application No. 09/981,891, filed on Oct. 19, 2001, now Pat. No. 6,661,099, which is a division of application No. 09/689,824, filed on Oct. 13, 2000, now Pat. No. 6,890,796, which is a division of application No. 09/062,720, filed on Apr. 20, 1998, now Pat. No. 6,175,159.

(30) Foreign Application Priority Data

Jul. 16, 1997 (JP) .................................. 9-190818

(51) Int. Cl.
*H01L 23/48* (2006.01)
(52) U.S. Cl. ...................... 257/784; 257/690
(58) Field of Classification Search ............... 257/784, 257/690, 737, 738, 778, 774
See application file for complete search history.

(56) References Cited

U.S. PATENT DOCUMENTS

| 4,030,309 A | 6/1977 | Mason |
| 4,664,578 A | 5/1987 | Kakehi |
| 4,735,548 A | 4/1988 | Kimata et al. |
| 4,770,590 A | 9/1988 | Hugues et al. |
| 4,871,290 A | 10/1989 | Kaczynski et al. |
| 5,011,366 A | 4/1991 | Miller |
| 5,135,349 A | 8/1992 | Lorenz et al. |
| 5,288,199 A | 2/1994 | Enomoto |
| 5,311,057 A | 5/1994 | McShane |
| 5,372,471 A | 12/1994 | Wu |
| 5,447,409 A | 9/1995 | Grunes et al. |
| 5,468,999 A | 11/1995 | Lin et al. |
| 5,584,647 A | 12/1996 | Uehara et al. |
| 5,739,585 A | 4/1998 | Akram et al. |
| 5,811,879 A | 9/1998 | Akram |
| 5,866,942 A | 2/1999 | Suzuki et al. |

(Continued)

FOREIGN PATENT DOCUMENTS

GB 2138775 10/1984

(Continued)

OTHER PUBLICATIONS

IBM Technical Disclosure Bulletin, vol. 24, No. 6, dated Nov. 1981, pp. 3017-3018, entitled "Vacuum Wafer Pick-Up Tip," by J.G. Ferrentino and L.H. Rosenfeld.

*Primary Examiner*—Roy Potter
(74) *Attorney, Agent, or Firm*—VolentineFrancos&Whitt,PLLC (57) ABSTRACT

A semiconductor package includes a substrate for mounting and fixing a semiconductor chip thereon and a connecting pattern. The substrate is provided with an elongate opening formed therein. The semiconductor chip is fixed with its surface being mounted on the substrate and with its electrode being aligned within the elongate opening. The electrode of the semiconductor chip is electrically connected to the connecting pattern via wires through the elongate opening. The elongate opening and the wires are sealed with resin.

12 Claims, 6 Drawing Sheets

U.S. PATENT DOCUMENTS

| | | |
|---|---|---|
| 6,175,159 B1 | 1/2001 | Sasaki |
| 6,252,298 B1 | 6/2001 | Lee et al. |
| 6,268,648 B1 * | 7/2001 | Fukutomi et al. ............ 257/678 |
| 6,342,726 B1 | 1/2002 | Miyazaki et al. |
| 6,348,741 B1 | 2/2002 | Ogino et al. |
| 6,433,440 B1 | 8/2002 | Ogino et al. |
| 6,452,279 B1 | 9/2002 | Shimoda et al. |
| 6,642,083 B1 | 11/2003 | Miyazaki et al. |
| 6,661,099 B1 * | 12/2003 | Sasaki ......................... 257/784 |

FOREIGN PATENT DOCUMENTS

| | | |
|---|---|---|
| JP | 58-178529 | 10/1983 |
| JP | 64-45827 | 2/1988 |
| JP | 8-306817 | 11/1996 |
| JP | 10-92972 | 4/1998 |

* cited by examiner

SEMICONDUCTOR DEVICE, SEMICONDUCTOR PACKAGE FOR USE THEREIN, AND MANUFACTURING METHOD THEREOF

CROSS REFERENCE TO RELATED APPLICATIONS

This is a divisional application of application Ser. No. 09/981,891, filed Oct. 19, 2001, now U.S. Pat. No. 6,661,099, which is a divisional application of Ser. No. 09/689,824, filed Oct. 13, 2000, now U.S. Pat. No. 6,890,796, which is a divisional application of application Ser. No. 09/062,720 filed Apr. 20, 1998, now U.S. Pat. No. 6,175,159, which are hereby incorporated by reference in their entirety for all purposes.

BACKGROUND OF THE INVENTION

1. Field of the Invention

The present invention relates to a small size semiconductor package, and more particularly, to a semiconductor package of substantially the same size as a semiconductor chip referred to as a chip size package, a semiconductor device using the semiconductor device, and a manufacturing method of the semiconductor device.

2. Description of the Related Art

These days, various apparatus including semiconductor devices, particularly portable apparatus and movable apparatus are being miniaturized and lightened. Semiconductor devices for use in these apparatus are thus desired to be miniaturized and lightened accordingly.

In order to meet the demands, a package of substantially the same size as a semiconductor chip referred to as a chip size package (hereinafter referred to as CSP) has recently been proposed, and some semiconductor devices using such a chip size package are implemented as products.

Figure 8:
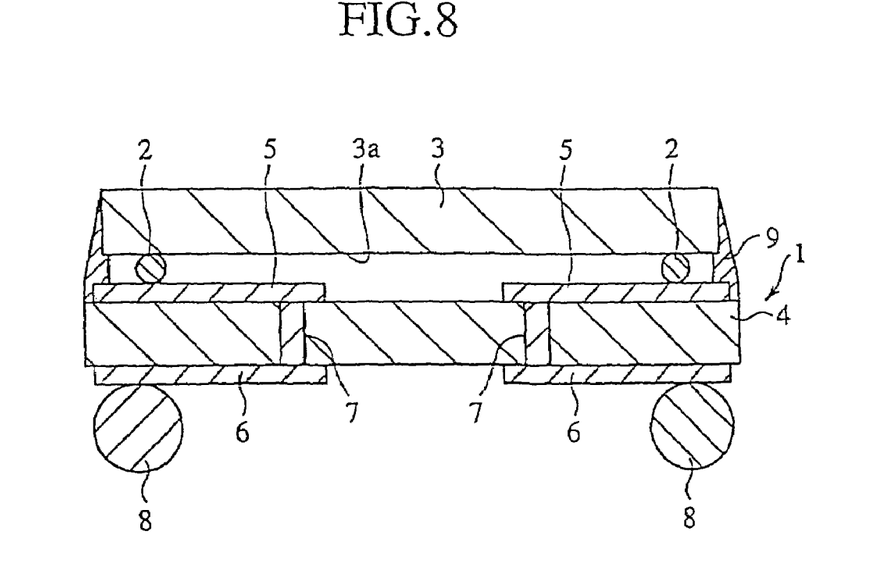
FIG. 8 is a sectional side elevation illustrating a schematic structure of an example of a conventional semiconductor device.

As a semiconductor device formed with a semiconductor chip mounted on a CSP, for example, as shown in FIG. 8, one in which a semiconductor chip 3 is mounted and fixed via bumps 2 on a semiconductor package 1 is known. In this semiconductor device, the semiconductor package 1 comprises a substrate 4, a conductive connecting pattern 5 formed on one side of the substrate 4, a conductive connecting pattern 6 formed on the other side of the substrate 4, and a wiring material 7 formed so as to pierce the substrate 4 for the purpose of making the connecting pattern 5 electrically connected to the connecting pattern 6. As the material of the substrate 4, ceramics are mainly used for the purpose of making smaller the difference of the coefficient of thermal expansion between the semiconductor chip 3 and the substrate 4 and thus making smaller the thermal stress to be applied to the bumps 2 and the semiconductor element 3.

The semiconductor chip 3 is fixed to the substrate 4 of the semiconductor package 1 thus structured with the conductive connecting pattern 5 formed on the one side of the substrate 4 being electrically connected thereto via the bumps 2 provided on a surface 3a where the element is formed. External connecting terminals 8 such as solder balls for bonding the conductive connecting pattern 6 to a mother board (not shown) are fixed to the conductive connecting pattern 6 formed on the other side of the substrate 4. By this, the bumps 2 of the semiconductor chip 3 are electrically connected to the external connecting terminals 8 via the connecting pattern 5, the wiring material 7, and the connecting pattern 6.

The semiconductor element chip 3 thus mounted on the semiconductor package 1 is integrally fixed to the semiconductor package 1 by sealing the whole periphery of the junction between the substrate and the semiconductor chip 3 with resin 9 referred to as underfile. It is to be noted that the resin 9 referred to as underfile also performs a function to disperse the above-mentioned thermal stress due to the difference of the coefficient of thermal expansion between the substrate 4 and the semiconductor chip 3.

Figure 9:
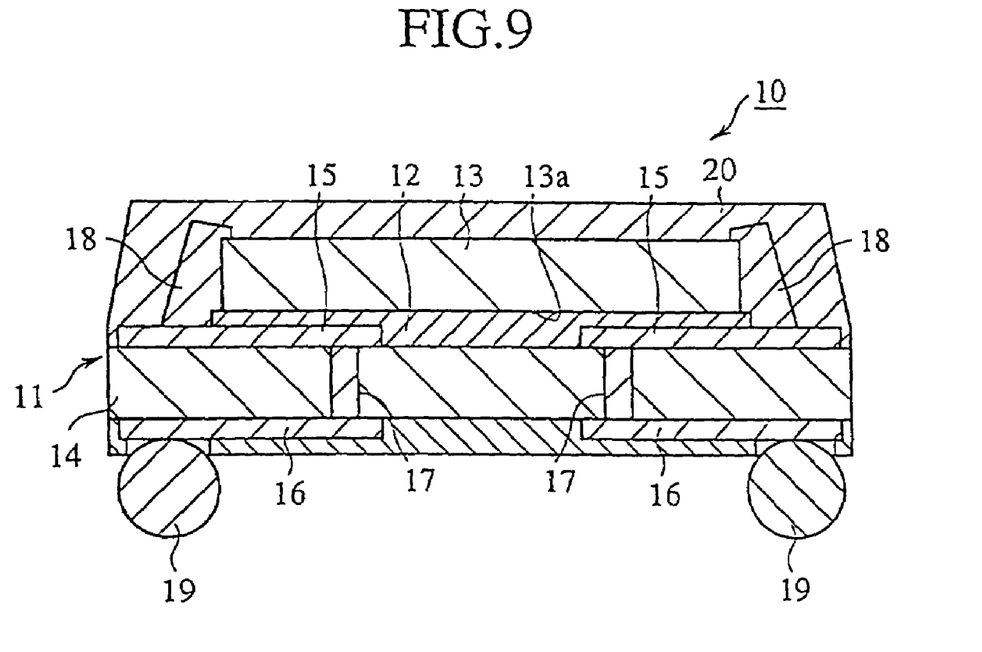
FIG. 9 is a sectional side elevation illustrating a schematic structure of another example of a conventional semiconductor device.

FIG. 9 illustrates another example of a semiconductor device formed with a semiconductor element mounted on a CSP. In FIG. 9, a semiconductor device 10 is generally referred to as a chip on board (COP). The semiconductor device 10 is formed by mounting and fixing a semiconductor chip 13 via adhesive 12 or the like on a semiconductor package 11.

The semiconductor package 11 comprises a substrate 14 the material of which is glass epoxy resin or the like, a conductive connecting pattern 15 formed on one side of the substrate 14, a conductive connecting pattern 16 formed on the other side of the substrate 14, and a wiring material 17 formed so as to pierce the substrate 14 for the purpose of making the connecting pattern 15 electrically connected to the connecting pattern 16.

A surface opposite to a surface 13a where the element is formed of the semiconductor chip 13 is fixed with the adhesive 12 to one side of the substrate 14 of the semiconductor package 11 thus structured. Further, an electrode (not shown) formed on the surface 13a where the element is formed of the semiconductor chip 13 is electrically connected to the connecting pattern 15 of the semiconductor package 11 via wires 18. External connecting terminals 19 such as solder balls for bonding the conductive connecting pattern 16 to a mother board (not shown) are fixed to the conductive connecting pattern 16 formed on the other side of the substrate 14. By this, the electrodes of the semiconductor chip 13 are electrically connected to the external connecting terminals 19 via the connecting pattern 15, the wiring material 17, and the connecting pattern 16. The semiconductor package 11 with the semiconductor chip 13 thus mounted thereon is further provided with resin 20 covering the one side of the substrate 14 and the semiconductor chip 13 for the purpose of protecting the surface 13a where the element is formed and the wires 18. By this, the semiconductor chip 13 and the wires 18 are sealed with the resin 20.

However, with the semiconductor device shown in FIG. 8, in order to decrease the thermal stress between the substrate 4 and the semiconductor chip 3, ceramics, which are expensive, have to be used as the material of the substrate 4, leading to high cost as a whole, which is a problem to be solved.

Further, with the semiconductor device 10 shown in FIG. 9, although, since the thermal stress between the substrate 14 and the semiconductor chip 13 can be absorbed by the wires 18, glass epoxy resin, which is inexpensive, can be used as the material of the substrate 14, since the wires 18 are disposed so as to go around to the outer peripheral side of the semiconductor chip 13 in this structure, the size of the semiconductor device 10 as a whole with respect to the semiconductor chip 13 is large, and thus, the semiconductor device 10 can not sufficiently meet the demands for miniaturizing and thinning the semiconductor device.

SUMMARY OF THE INVENTION

The present invention is made in view of the above, and therefore an object of the invention is to provide a semiconductor device which is of substantially the same size as a semiconductor chip, which thus sufficiently meets the demands for miniaturizing and thinning the semiconductor device, and which, at the same time, can be manufactured at a low cost, a manufacturing method thereof, and a semiconductor package suitably used in manufacturing the semiconductor device.

According to one aspect of the present invention, in order to solve the above-mentioned problem, a semiconductor package is comprised of a substrate for mounting a semiconductor chip thereon to fix the side of a surface where the element is formed of the semiconductor chip to one side thereof, and a connecting pattern provided on the other side of the substrate for electrical connection to the semiconductor chip, the substrate being provided with an elongate opening formed from the one side to the other side of the substrate.

With this semiconductor package, since an elongate opening is formed in the substrate and the connecting pattern is provided on the side of the substrate opposite to the side on which the surface where the element is formed of the semiconductor chip is mounted, an electrode formed on the surface where the element is formed of the semiconductor chip and the connecting pattern can be bonded with wires through the elongate opening. Accordingly, wires can be disposed without going around to the outer peripheral side of the semiconductor chip. This eliminates the necessity of securing space for the wires on the outer peripheral side of the semiconductor element.

Further, since wire bonding can be carried out, the wires can absorb the difference of the coefficient of thermal expansion between the semiconductor chip and the substrate, which makes it possible to use an inexpensive resin substrate instead of an expensive ceramics substrate.

According to another aspect of the present invention, in order to solve the above-mentioned problem, in a semiconductor device, a semiconductor package is comprised of a substrate for mounting a semiconductor chip thereon to fix the semiconductor chip to one side thereof, and a connecting pattern provided on the other side of the substrate, the substrate being provided with an elongate opening formed from the one side to the other side of the substrate, a surface where the element is formed of the semiconductor chip being mounted on the one side of the substrate, an electrode of the semiconductor chip being fixed to the one side so as to be within the elongate opening and being electrically connected to the connecting pattern via wires through the elongate opening, and the elongate opening and the wires being sealed with resin.

With this semiconductor device, since the semiconductor package of the present invention described above is used, and the electrode formed on the surface where the element is formed of the semiconductor chip and the connecting pattern of the substrate are bonded with wires through the elongate opening, the wires can be disposed without going around to the outer peripheral side of the semiconductor chip. This eliminates the necessity of space for the wires on the outer peripheral side of the semiconductor chip.

Further, since the semiconductor chip and the substrate are bonded with the wires, the wires can absorb the difference of the coefficient of thermal expansion between the semiconductor chip and the substrate, which makes it possible to use an inexpensive resin substrate instead of an expensive ceramics substrate.

According to still another aspect of the present invention, in order to solve the above-mentioned problem, a method of manufacturing a semiconductor device is comprised of the steps of preparing a semiconductor package structured by providing a substrate for mounting a semiconductor chip thereon to fix the semiconductor chip to one side thereof and a connecting pattern provided on the other side of the substrate and by forming an elongate opening from the one side to the other side of the substrate, fixing a surface where the element is formed of the semiconductor chip on the one side of the substrate of the semiconductor package such that an electrode of the semiconductor chip is within the elongate opening, electrically connecting the connecting pattern and the electrode of the semiconductor chip via wires through the elongate opening, and sealing the elongate opening and the wires with resin.

With this method of manufacturing a semiconductor device, since the semiconductor package of the present invention described above is used, and the electrode formed on the surface where the element is formed of the semiconductor chip and the connecting pattern of the substrate are bonded with wires through the elongate opening, the wires can be disposed without going around to the outer peripheral side of the semiconductor chip. This eliminates the necessity of space for the wires on the outer peripheral side of the semiconductor chip.

Further, since the semiconductor chip and the substrate are bonded with the wires, the wires can absorb the difference of the coefficient of thermal expansion between the semiconductor chip and the substrate, which makes it possible to use an inexpensive resin substrate instead of an expensive ceramics substrate.

BRIEF DESCRIPTION OF THE DRAWINGS

In the accompanying drawings:

FIGS. 2A and B are perspective views of the semiconductor device shown in FIG. 1 for explaining the structure thereof, and particularly, for explaining the rear surface side of a semiconductor package.

DETAILED DESCRIPTION OF THE PREFERRED EMBODIMENTS

The present invention will now be described in detail.

Figure 1:
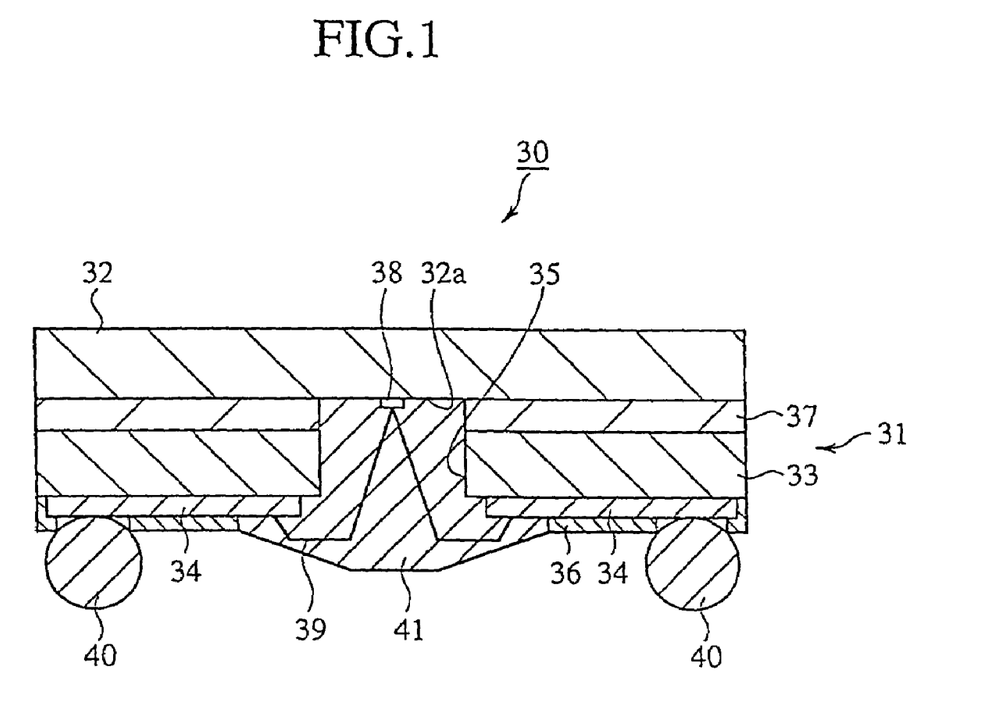
FIG. 1 is a sectional side elevation illustrating a schematic structure of a first embodiment of a semiconductor device according to the present invention.

FIG. 1 illustrates a first embodiment of a semiconductor device according to a fourth aspect of the present invention. In FIG. 1, reference numeral 30 denotes a semiconductor device, and the semiconductor device 30 is formed by mounting a semiconductor chip 32 on a semiconductor package 31. It is to be noted that the semiconductor package 31 in the semiconductor device 30 is a first embodiment of a semiconductor package according to the first aspect of the present invention.

Figures 2A, 2B:
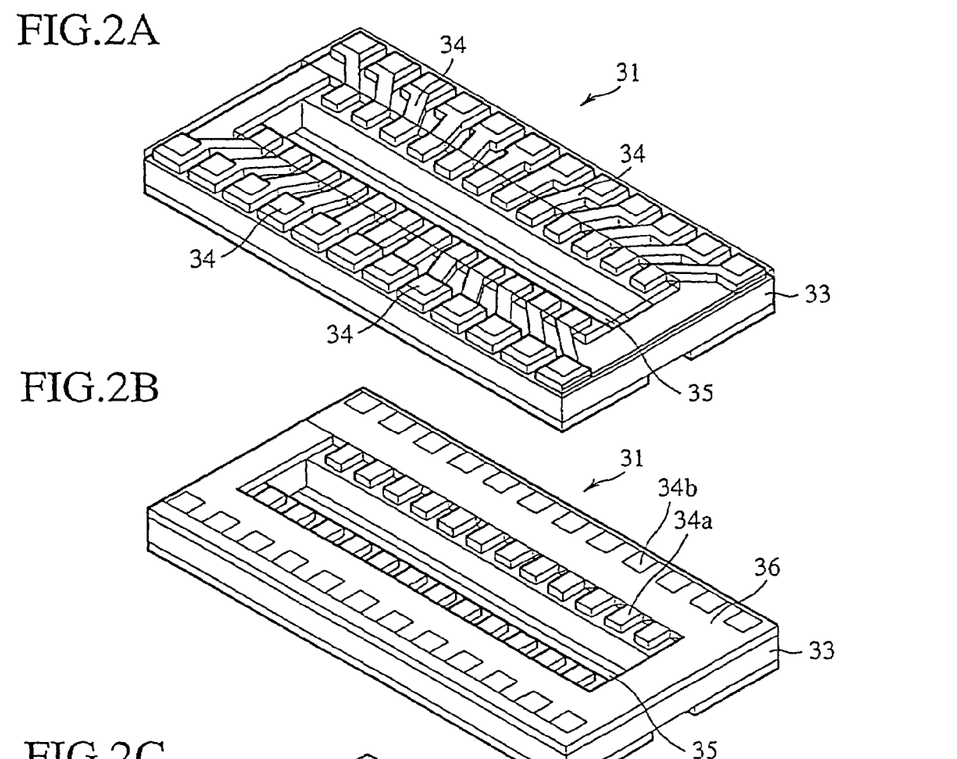

In the semiconductor device 30, the semiconductor package 31 comprises a rectangular substrate 33 for mounting the semiconductor chip 32 thereon to fix the side of a surface 32a where the element is formed of the semiconductor chip 32 to one side thereof, and a plurality of connecting patterns 34 provided on the other side of the substrate 33. The material of the substrate 33 is glass epoxy resin or the like. As shown in FIG. 2A, an elongate opening 35 is formed along the longitudinal center line of the substrate 33. The elongate opening 35 is formed as a rectangular opening from the one side to which the semiconductor chip 32 is fixed to the other side. It is to be noted that, as shown in FIGS. 1 and 2A, the respective connecting patterns 34 are formed so as to extend from longitudinal edge portions of the substrate 33 to the elongate opening 35, and are made of metal or the like and are conductive.

As shown in FIGS. 1 and 2B, an insulating film 36 covering the connecting patterns 34 with the connecting patterns 34 being partly exposed is formed on the other side of the substrate 33 on which the connecting patterns 34 are formed. The insulating film 36 is made of resist or the like, and is provided with end portions 34a of the connecting patterns 34 on the side of the elongate opening 35 and portions other than the end portions 34a, in this example, end portions 34b opposite to the end portions 34a, exposed, and with the elongate opening 35 left opened, i.e., without covering the elongate opening 35.

Figure 2C:
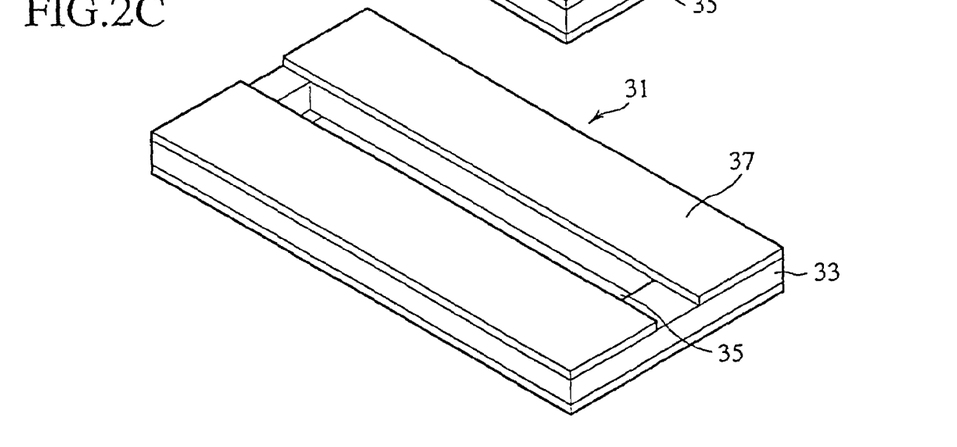
FIG. 2C is a perspective view of the semiconductor device shown in FIG. 1 for explaining the structure thereof, and particularly, for explaining the front surface side of the semiconductor package.

As shown in FIGS. 1 and 2C, a tape-like bonding material 37 is provided on the one side of the substrate 33 of the semiconductor package 31 thus structured with a portion around the longitudinal center line of the elongate opening 35 being opened. The bonding material 37 is formed by applying thermoplastic adhesive such as polyamideimide or thermosetting adhesive such as modified epoxy resin on both sides of a tape base material made of resin such as polyimide.

Figure 3:
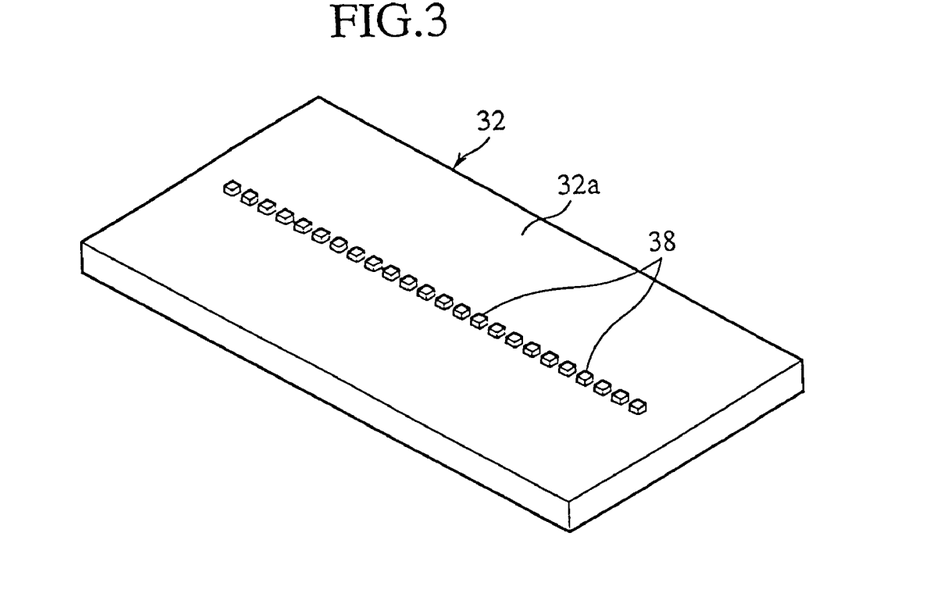
FIG. 3 is a perspective view of a semiconductor chip illustrating a surface where the element is formed.

As shown in FIG. 1, the semiconductor chip 32 is mounted and fixed via the bonding material 37 on the one side of the substrate 33. As shown in FIG. 3, the semiconductor chip 32 is like a rectangular plate with a plurality of electrodes 38 formed on the longitudinal center line of the surface 32a where the element is formed. The electrodes 38 are disposed within the elongate opening 35.

Figure 4:
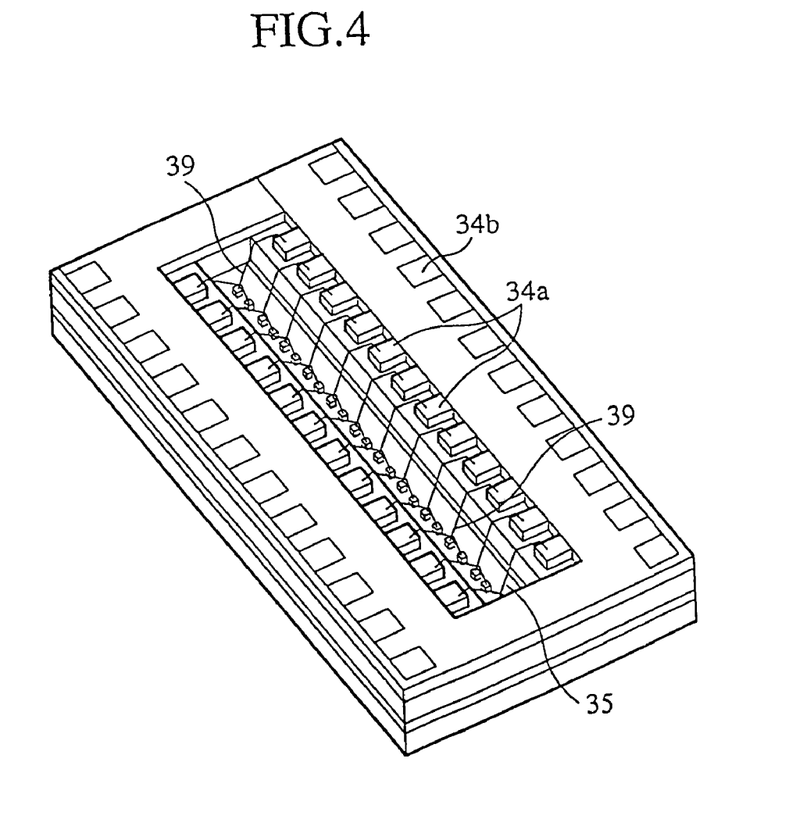
FIG. 4 is a perspective view of the semiconductor device for explaining the rear surface side thereof.

As shown in FIGS. 1 and 4, the electrodes 38 of the semiconductor chip 32 disposed within the elongate opening 35 are connected to the end portions 34a of the connecting patterns 34 via wires 39 through the elongate opening 35. By this, the electrodes 38 are electrically connected to the connecting patterns 34.

As shown in FIG. 1, external connecting terminals 40 such as solder balls are connected to the other exposed end portions 34b of the connecting patterns 34. By this structure, the electrodes 38 of the semiconductor chip 32 are electrically connected to the external connecting terminals 40 via the wires 39 and the connecting patterns 34.

Figure 5:
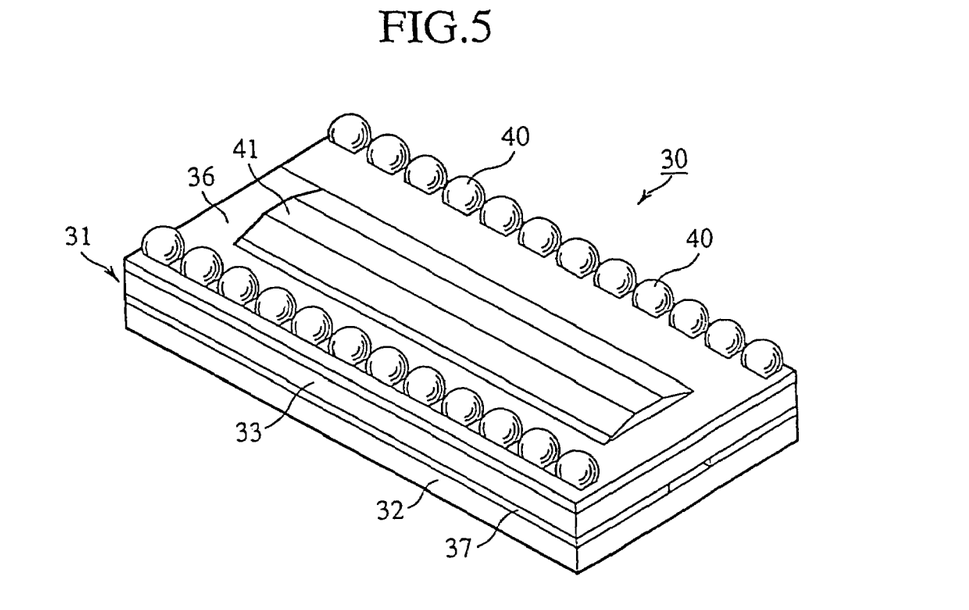
FIG. 5 is a perspective view of the semiconductor device for explaining the rear surface side thereof.

Further, as shown in FIGS. 1 and 5, the elongate opening 35 through which the wires 39 for connecting the electrodes 38 to the connecting patterns 34 are disposed is filled with insulating resin 41 covering the end portions 34a of the connecting patterns 34. By this, the electrodes 38, the wires 39, and the end portions 34a of the connecting patterns 34 are sealed and insulated from the external.

Next, a method of manufacturing the semiconductor device 30 thus structured is described. It is to be noted that the example of a manufacturing method described herein is an embodiment according to a seventh aspect of the present invention.

First, the semiconductor package 31 shown in FIGS. 2A–C and the semiconductor chip 32 shown in FIG. 3 are prepared. Here, the tape-like bonding material 37 provided on the one side of the substrate 33 of the semiconductor package 31 may be provided on the side of the semiconductor chip 32 instead of being provided on the side of the substrate 33.

Next, the semiconductor chip 32 is mounted on one side of the semiconductor package 31 thus prepared with the electrodes 38 of the semiconductor chip 32 being within the elongate opening 35. Next, by heating and pressurizing them with this state maintained, the substrate 33 of the semiconductor package 31 and the surface 32a where the element is formed of the semiconductor chip 32 are made to closely adhere to each other. By melting and solidifying, or by curing, the adhesive of the bonding material 37, the semiconductor chip 32 is fixed to the one side of the substrate 33.

Then, as shown in FIG. 4, wire bonding is carried out with respect to the electrodes 38 within the elongate opening 35 in the substrate 33 and the corresponding end portions 34a of the connecting patterns 34 on the other side of the substrate 33. Next, the electrodes 38 are electrically connected to the connecting patterns 34 via the wires 39 through the elongate opening 35. It is to be noted that a conventionally used wire bonder may be used to carry out the wire bonding.

Then, as shown in FIG. 5, the elongate opening 35 is filled with the insulating resin 41 such as epoxy resin, and the insulating resin 41 is applied so as to cover the wires 38 and the end portions 34a of the connecting patterns 34 to seal all of the electrodes 38, the wires 39, and the end portions 34a of the connecting patterns 34.

After that, the external connecting terminals 40 such as solder balls are bonded to the respective end portions 34b of the connecting patterns 34 under high temperature to obtain the semiconductor device 30.

With the semiconductor device 30 thus obtained, since the electrodes 38 formed on the surface 32a where the element is formed of the semiconductor chip 32 and the connecting patterns 34 of the substrate 33 are bonded with the wires 39 through the elongate opening 35, it is not necessary to provide space for the wires 39 on the outer peripheral side of the semiconductor chip 32, which leads to miniaturizing and thinning the device as a whole.

Further, since the semiconductor chip 32 and the substrate 33 are bonded with the wires, the wires 39 can absorb the difference of the coefficient of thermal expansion between the semiconductor chip 32 and the substrate 33, which makes it possible to use an inexpensive resin substrate instead of an expensive ceramics substrate.

Figure 6:
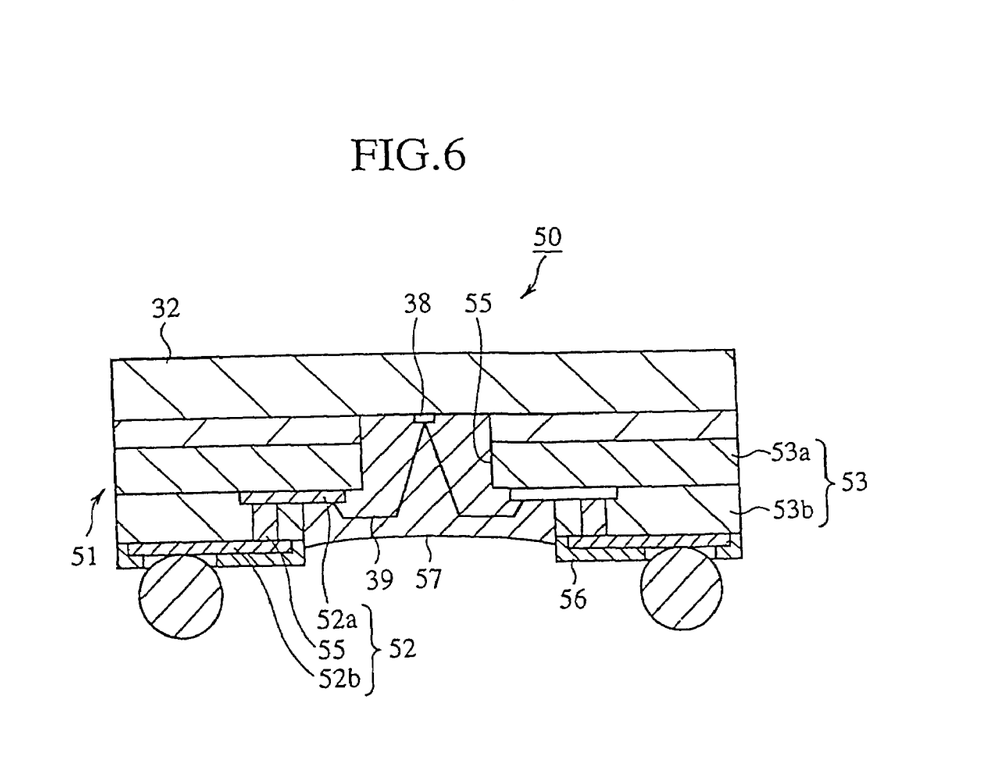
FIG. 6 is a sectional side elevation illustrating a schematic structure of a second embodiment of a semiconductor device according to the present invention.

FIG. 6 illustrates a second embodiment of a semiconductor device according to the fourth aspect of the present invention. The difference between a semiconductor device 50 in FIG. 6 and the semiconductor device 30 shown in FIG. 1 resides in the structure of a semiconductor package 51 in the semiconductor device 50. The semiconductor package 51 in the semiconductor device 50 is a second embodiment of a semiconductor package according to the first aspect of the present invention. The semiconductor package 51 differs from the semiconductor package 31 shown in FIG. 1 in that its connecting patterns 52 are formed in a plurality of stages (two stages in this example).

More specifically, a substrate 53 of the semiconductor package 51 is formed of an upper plate 53a and a lower plate 53b. The lower plate 53b is formed such that its edge on the side of an elongate opening 54 is outside an edge of the upper plate 53a. By this structure, the rear surface (the other side) of the substrate 53 is formed to be in two stages, i.e., the rear surface of the upper plate 53a and the rear surface of the lower plate 53b.

A first plurality of connecting patterns 52a are provided on the rear surface of the upper plate 53a of the substrate 53. A second plurality of connecting patterns 52b are provided on the rear surface of the lower plate 53b. The first and the second connecting patterns 52a and 52b are electrically connected to each other via a wiring material 55 provided so as to pierce the lower plate 53b. By this structure, the connecting patterns 52 are in two stages (a plurality of stages) formed by the first connecting patterns 52a, the wiring material 55, and the second connecting patterns 52b.

An insulating film 56 is formed on the rear surface of the lower plate 53b so as to cover the second connecting patterns 52b. It is to be noted that, in this example also, the insulating film 56 is formed with the second connecting patterns 52b being partly exposed, that is, similarly to the one shown in FIG. 2B, with longitudinal end portions of the substrate 53 being exposed.

In the elongate opening 54 formed with the stages in the substrate 53 formed of the upper plate 53a and the lower plate 53b in this way, the electrodes 38 of the semiconductor chip 32 disposed within the elongate opening 54 are connected via the wires 39 to the end portions of the first connecting patterns 52a exposed on the rear surface of the upper plate 53a of the substrate 53. Further, the elongate opening 54 is filled with insulating resin 57 covering the wires 39 and the end portions of the first connecting patterns 52a. By this, the electrodes 38, the wires 39, and the end portions of the first connecting patterns 52a are sealed and insulated from the external.

With the semiconductor device 50 thus structured, similarly to the case of the semiconductor device 30 shown in FIG. 1, since it is not necessary to provide space for the wires 39 on the outer peripheral side of the semiconductor chip 32, the device can be miniaturized and thinned as a whole. Further, since the wires 39 can absorb the difference of the coefficient of thermal expansion between the semiconductor chip 32 and the substrate 53, an inexpensive resin substrate can be used as the substrate 53.

Still further, since the substrate 53 is formed in two stages of the upper plate 53a and the lower plate 53b, and the connecting patterns 52 are in two stages (a plurality of stages) formed by the first connecting patterns 52a, the wiring material 55, and the second connecting patterns 52b, such that the wires 39 are connected to the end portions to the central side of the substrate 53, that is, to the end portions provided on a stage on the side of the one side of the substrate 53, the wires 39 may be cased within the elongate opening 54 without extending to the outside. By this, the wires 39 can be covered with the insulating resin 57 just by filling the elongate opening 54 with the insulating resin 57 at the bottom of the substrate 53 without heaping up the insulating resin 57 on the rear surface of the lower plate 53b. Accordingly, the diameter of the external connecting terminals 40 such as solder balls can be made small, which leads to finer pitch of the external connecting terminals 40.

Figure 7:
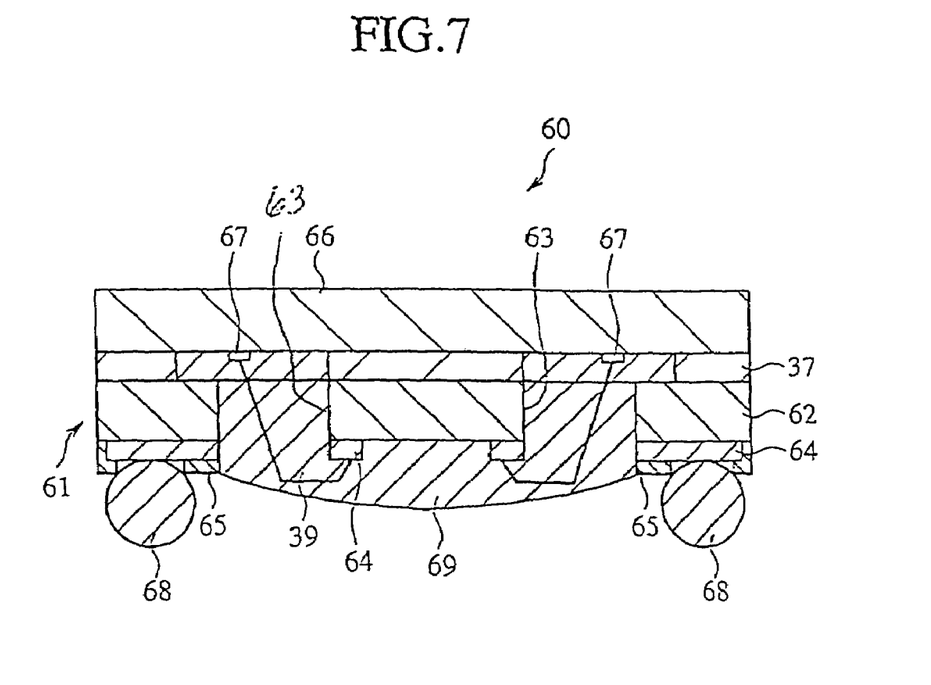
FIG. 7 is a sectional side elevation illustrating a schematic structure of a third embodiment of a semiconductor device according to the present invention.

FIG. 7 illustrates a third embodiment of a semiconductor device according to the fourth aspect of the present invention. The difference between a semiconductor device 60 in FIG. 7 and the semiconductor device 30 shown in FIG. 1 resides in the structure of a semiconductor package 61 in the semiconductor device 60. The semiconductor package 61 in the semiconductor device 60 is a third embodiment of a semiconductor package according to the first aspect of the present invention. The semiconductor package 61 differs from the semiconductor package 31 shown in FIG. 1 mainly in that a plurality of elongate opening 63, two elongate openings 63 in this example, are formed in a substrate 62.

More specifically, two lines of the elongate openings 63 are formed in the substrate 62 of the semiconductor package 61 along the longitudinal direction of the substrate 62. Connecting patterns 64 are formed and disposed so as to cross the elongate openings 63 from the outside of the elongate openings 63 (from the longitudinal sides of the substrate 62) to the central side of the elongate openings 63. Outside end portions of the connecting patterns 64 are covered with an insulating film 65 with part of them being exposed toward the outside.

Two lines of electrodes 67 are formed on a surface where the element is formed of a semiconductor chip 66 mounted on the semiconductor package 61 of the semiconductor device 60. The respective electrodes 67 are disposed within either of the elongate openings 63 in the substrate 62.

The electrodes 67 are connected to the connecting patterns 64 via the wires 39 through the elongate openings 63. By this, the electrodes 67 are electrically connected to external connecting terminals 68 connected to the end portions of the connecting patterns 64.

Further, the elongate openings 63 are filled with insulating resin 69 covering the wires 39 and the end portions of the connecting patterns 64 on the side connected to the wires 39. By this, the electrodes 67, the wires 39, and the end portions of the connecting patterns 64 are sealed and insulated from the external.

With the semiconductor device 60 thus structured, similarly to the case of the semiconductor device 30 shown in FIG. 1, since it is not necessary to provide space for the wires 39 on the outer peripheral side of the semiconductor chip 66, the device can be miniaturized and thinned as a whole. Further, since the wires 39 can absorb the difference of the coefficient of thermal expansion between the semiconductor chip 66 and the substrate 62, an inexpensive resin substrate can be used as the substrate 62.

Still further, the semiconductor chip 66 in which the electrodes 67 are disposed on the peripheral side instead of the central portion of the semiconductor chip 66 as the semiconductor chip to be mounted on the semiconductor package 61.

It is to be noted that though the tape-like bonding material 37 is used to fix the semiconductor chip on the substrate of the semiconductor package in the embodiments described in the above, the present invention is not limited thereto, and liquid adhesive such as epoxy resin may be used instead of the bonding material 37.

As described in the above, in the semiconductor package according to a first aspect of the invention, since the elongate opening is formed in the substrate and the connecting pattern is provided on the side of the substrate opposite to the side on which the surface where the element is formed of the semiconductor chip is mounted, an electrode formed on the surface where the element is formed of the semiconductor chip and the connecting pattern can be bonded with wires through the elongate opening. Accordingly, wires can be disposed without going around to the outer peripheral side of the semiconductor chip. This eliminates the necessity of securing space for the wires on the outer peripheral side of the semiconductor chip, and thus, a semiconductor device using this can be miniaturized and thinned.

Further, since wire bonding can be carried out, the wires can absorb the difference of the coefficient of thermal expansion between the semiconductor chip and the substrate, which makes it possible to use an inexpensive resin substrate instead of an expensive ceramics substrate. By this, the cost of the semiconductor device can be lowered.

In the semiconductor device according to the fourth aspect of the invention, since the semiconductor package of the first aspect of the present invention is used, and the electrode formed on the surface where the element is formed of the semiconductor chip and the connecting pattern of the substrate are bonded with wires through the elongate opening, the wires can be disposed without going around to the outer peripheral side of the semiconductor chip. This eliminates the necessity of space for the wires on the outer peripheral side of the semiconductor chip, and thus, the device can be miniaturized and thinned as a whole.

Further, since the semiconductor chip and the substrate are bonded with the wires, the wires can absorb the difference of the coefficient of thermal expansion between the semiconductor chip and the substrate, which makes it possible to use an inexpensive resin substrate instead of an expensive ceramics substrate. By this, the cost of the semiconductor device can be lowered.

In the method of manufacturing a semiconductor device according to the seventh aspect of the invention, since the semiconductor package of the first aspect of the present invention is used, and the electrode formed on the surface where the element is formed of the semiconductor chip and the connecting pattern of the substrate are bonded with wires through the elongate opening, the wires can be disposed without going around to the outer peripheral side of the semiconductor chip. This eliminates the necessity of space for the wires on the outer peripheral side of the semiconductor chip, and thus, the device can be miniaturized and thinned as a whole.

Further, since the semiconductor element and the substrate are bonded with the wires, the wires can absorb the difference of the coefficient of thermal expansion between the semiconductor chip and the substrate, which makes it possible to use an inexpensive resin substrate instead of an expensive ceramics substrate. By this, the cost of the semiconductor device can be lowered.

What is claimed is:

1. A semiconductor device comprising:
    a substrate having a first surface and a second surface opposed to the first surface, said substrate futher having an elongate opening defined therethrough from the first surface to the second surface;
    a plurality of connecting patterns located on the second surface of said substrate, each of said plurality of connecting patterns having a first end;
    a semiconductor chip having a surface which is mounted to the first surface of said substrate;
    a plurality of electrodes located on the surface of said semiconductor chip and aligned with said elongate opening of said substrate;
    a plurality of wires extending within said elongate opening of said substrate, first ends of said plurality of wires being respectively bonded to said plurality of electrodes and second ends of said plurality of wires being respectively bonded to corresponding ones of said plurality of connecting patterns;
    a resin which covers said plurality of electrodes, said plurality of wires, and the first ends of said plurality of connecting patterns;
    a resist which covers side walls of said plurality of connecting patterns and second ends of said plurality of connecting patterns; and
    a plurality of external connecting terminals respectively bonded to the second ends of said plurality of connecting patterns through said resist,
    wherein said resin extends out of said elongate opening beyond a height of said plurality of connecting patterns at which said plurality of external connecting terminals are bonded.

2. A semiconductor device as claimed in claim 1, wherein said substrate includes an upper plate and a lower plate which define a step configuration in the second surface of said substrate, wherein the upper plate is located between said semiconductor chip and said lower plate, and wherein said plurality of connecting patterns extend continuously from the upper plate to the lower plate such that the first ends of said plurality of connecting patterns are located on the upper plate.

3. A semiconductor device as claimed in claim 1, wherein said elongate opening is smaller than said semiconductor chip.

4. A semiconductor device according to claim 1, further comprising a bonding material formed on an entirety of the first surface of said substrate, wherein said semiconductor chip is mounted on the first surface of said substrate via said bonding material.

5. A semiconductor device according to claim 1, wherein said plurality of external connecting terminals are solder balls.

6. A semiconductor device comprising:
    a substrate having a first surface and a second surface opposed to the first surface, said substrate futher having an elongate opening defined therethrough from the first surface to the second surface;
    a plurality of connecting patterns located on the second surface of said substrate, each of said plurality of connecting patterns having a first end;
    a semiconductor chip having a surface which is mounted to the first surface of said substrate;
    a plurality of electrodes located on the surface of said semiconductor chip and aligned with said elongate opening of said substrate;
    a plurality of wires extending within said elongate opening of said substrate, first ends of said plurality of wires being respectively bonded to said plurality of electrodes and second ends of said plurality of wires being respectively bonded to corresponding ones of said plurality of connecting patterns;
    a resin which covers said plurality of electrodes, said plurality of wires, and the first ends of said plurality of connecting patterns;
    a resist which covers side walls of said plurality of connecting patterns and second ends of said plurality of connecting patterns; and
    a plurality of external connecting terminals respectively bonded to the second ends of said plurality of connecting patterns through said resist,
    wherein said resin extends out of said elongate opening less than a height of said plurality of connecting patterns at which said plurality of external connecting terminals are bonded.

7. A semiconductor device comprising:
- a substrate having a first surface and a second surface opposed to the first surface, said substrate further having first and second elongate openings defined therethrough from the first surface to the second surface;
- a plurality of connecting patterns located on the second surface of said substrate, each of said plurality of connecting patterns having a first end;
- a semiconductor chip having a surface which is mounted to the first surface of said substrate;
- a plurality of electrodes located on the surface of said semiconductor chip, each of said plurality of electrodes aligned with one of said first and second elongate openings of said substrate;
- a plurality of wires each extending within one of said first and second elongate openings of said substrate, first ends of said plurality of wires being respectively bonded to said plurality of electrodes and second ends of said plurality of wires being respectively bonded to corresponding ones of said plurality of connecting patterns;
- a resin which covers said plurality of electrodes, said plurality of wires, and the first ends of said plurality of connecting patterns;
- a resist which covers side walls of said plurality of connecting patterns and second ends of said plurality of connecting patterns; and
- a plurality of external connecting terminals respectively bonded to the second ends of said plurality of connecting patterns through said resist,
- wherein said resin extends out of said first and second elongate openings beyond a height of said plurality of connecting patterns at which said plurality of external connecting terminals are bonded.

8. A semiconductor device as claimed in claim 7, wherein said substrate includes an upper plate and a lower plate which define a step configuration in the second surface of said substrate, wherein the upper plate is located between said semiconductor chip and the lower plate, and wherein said plurality of connecting patterns extend continuously from the upper plate to the lower plate such that the first ends of said plurality of connecting patterns are located on the upper plate.

9. A semiconductor device as claimed in claim 7, wherein said first and second elongate openings are smaller than said semiconductor chip.

10. A semiconductor device according to claim 7, further comprising a bonding material formed on an entirety of the first surface of said substrate, wherein said semiconductor chip is mounted on the first surface of said substrate via said bonding material.

11. A semiconductor device according to claim 7, wherein said plurality of external connecting terminals are solder balls.

12. A semiconductor device comprising:
- a substrate having a first surface and a second surface opposed to the first surface, said substrate further having first and second elongate openings defined therethrough from the first surface to the second surface;
- a plurality of connecting patterns located on the second surface of said substrate, each of said plurality of connecting patterns having a first end;
- a semiconductor chip having a surface which is mounted to the first surface of said substrate;
- a plurality of electrodes located on the surface of said semiconductor chip, each of said plurality of electrodes aligned with one of said first and second elongate openings of said substrate;
- a plurality of wires each extending within one of said first and second elongate openings of said substrate, first ends of said plurality of wires being respectively bonded to said plurality of electrodes and second ends of said plurality of wires being respectively bonded to corresponding ones of said plurality of connecting patterns;
- a resin which covers said plurality of electrodes, said plurality of wires, and the first ends of said plurality of connecting patterns;
- a resist which covers side walls of said plurality of connecting patterns and second ends of said plurality of connecting patterns; and
- a plurality of external connecting terminals respectively bonded to the second ends of said plurality of connecting patterns through said resist,
- wherein said resin extends out of said first and second elongate openings less than a height of said plurality of connecting patterns at which said plurality of external connecting terminals are bonded.

* * * * *